(12) United States Patent
Brintzinger et al.

(10) Patent No.: US 6,210,995 B1
(45) Date of Patent: Apr. 3, 2001

(54) METHOD FOR MANUFACTURING FUSIBLE LINKS IN A SEMICONDUCTOR DEVICE

(75) Inventors: Axel C. Brintzinger, Fishkill, NY (US); Jeffrey Gambino, Gaylordsville, CT (US); Thomas Rupp, Stormville; Scott Halle, Hopewell Junction, both of NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/393,096

(22) Filed: Sep. 9, 1999

(51) Int. Cl.⁷ .................................................. H01L 21/82
(52) U.S. Cl. .............................................................. 438/132
(58) Field of Search ............................. 438/132; 257/529

(56) References Cited

U.S. PATENT DOCUMENTS

| 4,169,000 | 9/1979 | Riseman . |
| 4,209,894 | 7/1980 | Keen . |
| 4,460,914 | 7/1984 | Te Velde et al . |
| 4,536,948 | 8/1985 | Te Velde et al. . |
| 4,774,561 | 9/1988 | Takagi . |
| 4,879,587 | 11/1989 | Jerman et al. . |
| 5,291,434 | 3/1994 | Kowalski . |
| 5,585,662 | 12/1996 | Ogawa . |
| 5,641,701 | 6/1997 | Fukuhara et al. . |
| 5,679,967 | 10/1997 | Janai et al. . |

FOREIGN PATENT DOCUMENTS

| 03-04256 | 2/1991 | (JP) . |
| 03-169049 | 7/1991 | (JP) . |

*Primary Examiner*—Charles Bowers
*Assistant Examiner*—Evan Pert
(74) *Attorney, Agent, or Firm*—Rosenman & Colin LLP; Todd M.C. Li

(57) ABSTRACT

In order to form a cavity for a fusible link in a semiconductor device, an etchable material is applied over and around a portion of the fusible link and the etchable material is coated with a protection layer. The access abutting the etchable material is formed through the protection layer. After the removal of the etchable material, the access is partially filled with a refilling material to thereby form the cavity.

6 Claims, 4 Drawing Sheets

METHOD FOR MANUFACTURING FUSIBLE LINKS IN A SEMICONDUCTOR DEVICE

FIELD OF THE INVENTION

The present invention relates to a method for manufacturing electrically fusible links in VLSI circuits; and, more particularly, to a method for manufacturing fusible links having a cavity for accommodating a fused material.

DESCRIPTION OF THE PRIOR ART

In a typical integrated circuit, a large number of semiconductor devices may be fabricated on a silicon substrate. To achieve the desired functionality, a plurality of conductors are typically provided to couple selected devices together. In some integrated circuits, some of the conductive links may be coupled to fuses, which may be cut or blown after fabrication using lasers. In a dynamic random access memory (DRAM) circuit, for example, fuses may be employed during manufacturing to protect some of the transistors' gate stacks from destruction due to inadvertent built-up charges. Once fabrication of the IC is substantially complete, the fuses may be blown or cut to permit the DRAM circuit to function as if the protective current paths never existed. More commonly, fuses may be employed to set the enable bit and the address bits of a redundant array element in a DRAM circuit. To facilitate discussion, FIG. 1 illustrates a typical dynamic random access memory (DRAM) integrated circuit, including a main memory array 202. To facilitate replacement of a defective main array element within main memory array 202, a redundant array 204 is provided as shown. A plurality of fuses in fuse array 206 are coupled to redundant array 204 via a fuse latch array 208 and a fuse decoder circuit 210. To replace a defective main memory array element, individual fuses in fuse array 206 may be blown or cut to set their values to either a "1" or a "0" as required by the decoder circuit. During operation, the values of the fuses in fuse array 206 are typically loaded into fuse latch array 208 upon power up. These values are then decoded by fuse decoder circuit 210 during run time, thereby facilitating the replacement of specific failed main memory array elements with specific redundant elements of redundant array 204. Techniques for replacing failed main memory array elements with redundant array elements are well known in the art and will not be discussed in great detail here for brevity's sake. As mentioned earlier, the fuse links within fuse array 206 may be selectively blown or cut with a laser beam. Once blown by the laser beam, the fuse changes from a highly conductive state to a highly resistive, i.e., non-conductive state, i.e., a blown fuse inhibits current from flowing through and represents an open circuit to the current path.

High density dynamic random access memories (DRAM) are designed with memory cell redundancy. The redundant memory cells are incorporated therein to prevent the loss of entire memories in the event that a minor number of memory cells do not function. Activation of the redundant memory cells is accomplished by fusible links which are strategically placed throughout the memory. Activation of a fusible link results in the disabling of the defective memory cell, while enabling in its place a redundant memory cell.

The process of "blowing" fusible links is implemented by heating the fusible link which is to be blown. The heated fusible link melts or evaporates, creating an open circuit for replacing the defective memory cells with a functional cell.

The fusible links are made of aluminum, copper and other high conductive metal or metal alloy. The conductive fusible link generally has a central width portion which is smaller than the ends to reduce the amount of energy necessary to melt the fusible link to create an open circuit condition. A small necked down portion of the fusible link acts as a fuse and can be blown out by an over-current or an over-voltage selectively applied in order to each memory cell. Usually the fusible link is made of a thin film of refractory metal.

FIG. 2 shows a schematic of a typical DRAM cell having a field effect transistor(FET) 100 and a fusible link 200. The gate 110 of the FET 100 acts as the wordline W/L 120. A bitline B/L 170 is connected to one terminal of the fusible link 200. The other terminal of the fusible link 200 is connected to the one terminal 140, e.g., a source terminal, of the FET 100, depending on the applications such as read and write operations. The other DRAM terminal 150, e.g., a drain terminal, is referred to as a plate.

The fusible link will melt causing an increase in volume when it is blown. Since, however, the melted fusible link was conventionally constrained within the a protective layer to prevent deterioration, it has to form a path by itself resulting in only a very small separation of the melted fusible link end. This can cause unwanted shorts or low resistance.

SUMMARY OF THE INVENTION

It is, therefore, an object of the present invention to provide an improved fusible link DRAM containing a cavity which contains the melted fusible link.

In accordance with one aspect of the present invention, there is a method for forming a cavity for a fusible link in a semiconductor device comprising the steps of:

applying an etchable material over and around a portion of the fusible link;

coating the etchable material with a protection layer;

forming an access abutting the etchable material through the protection layer;

removing the etchable material to leave a cavity; and refilling the access with a refilling material.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
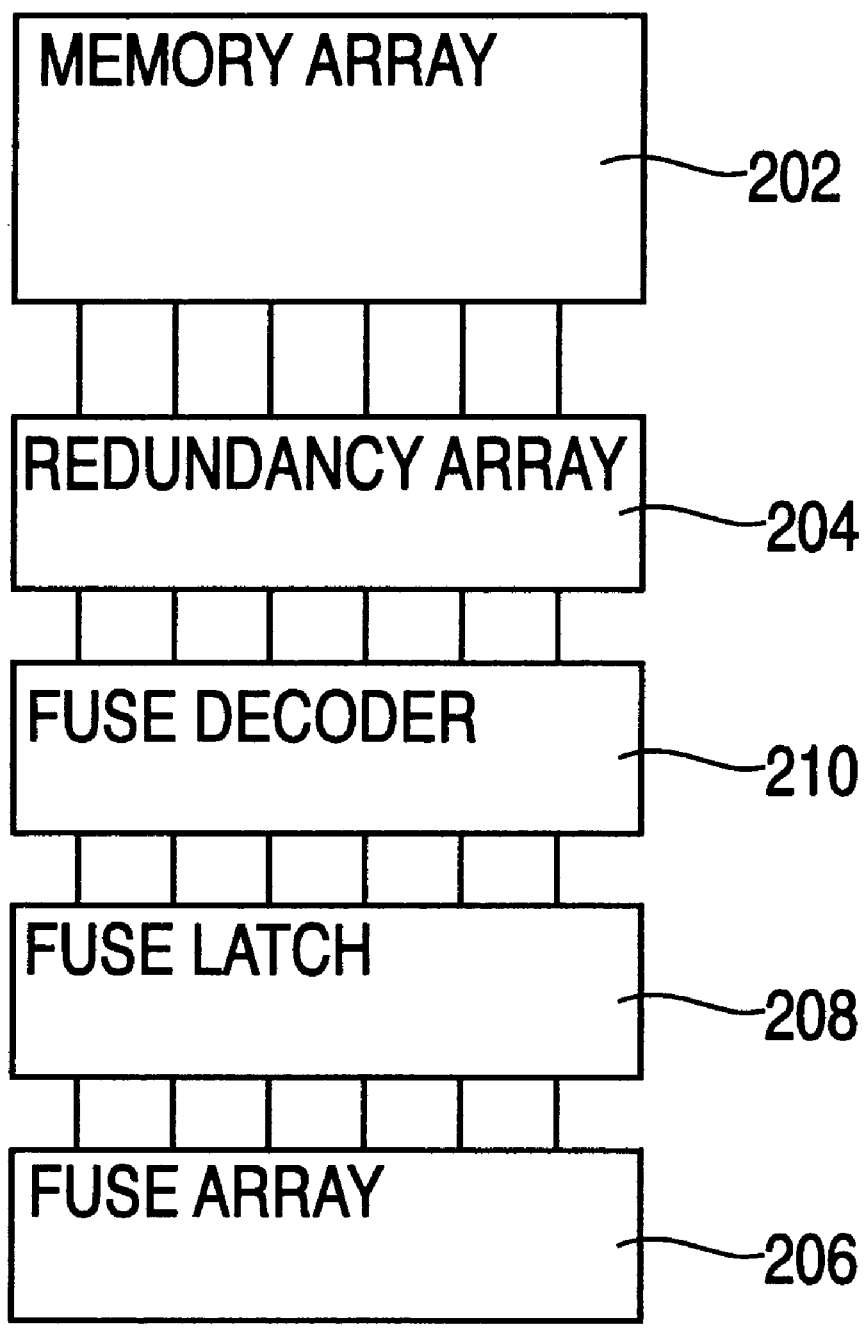
FIG. 1 shows a typical DRAM integrated Circuit.
Figure 2:
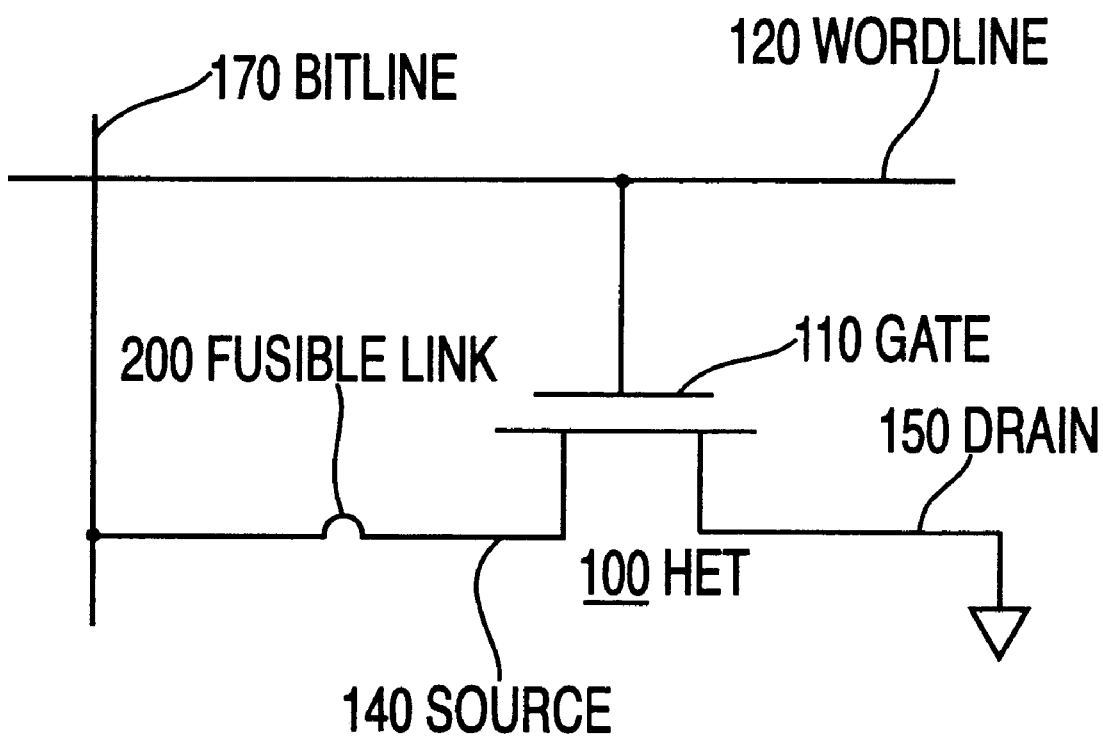
FIG. 2 shows an electrical schematic diagram for a conventional DRAM cell with a fusible link.
Figure 3A:
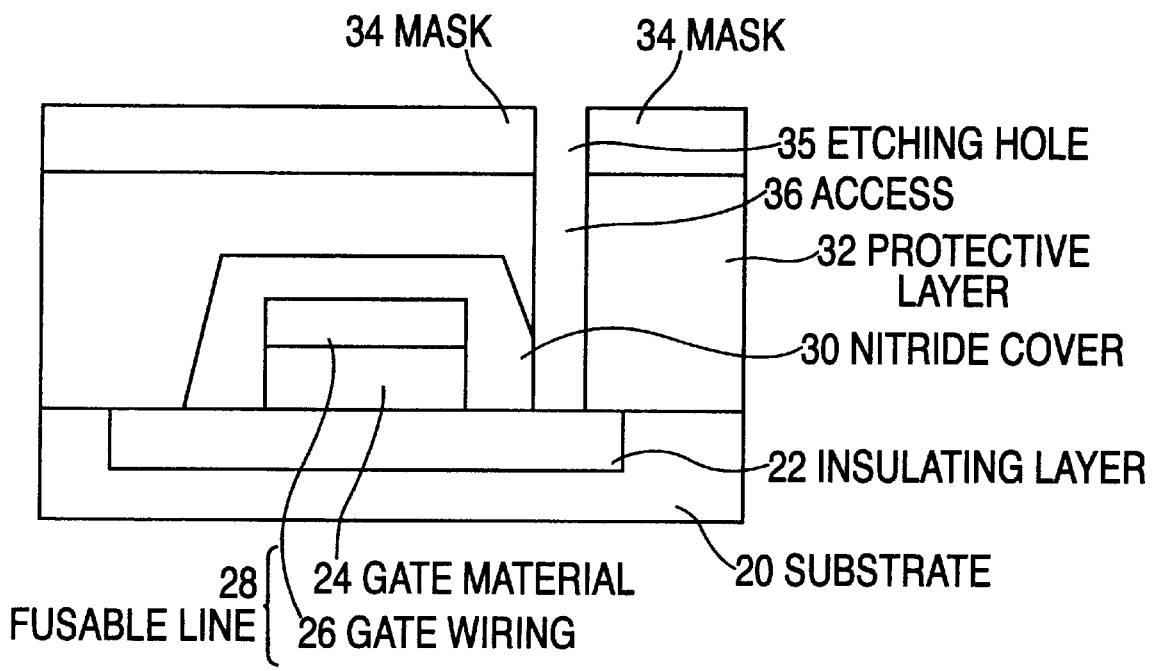
FIGS. 3a to 3c represent cross section views showing a fusible link at various stages of manufacture in accordance with the present invention.
Figure 3B:
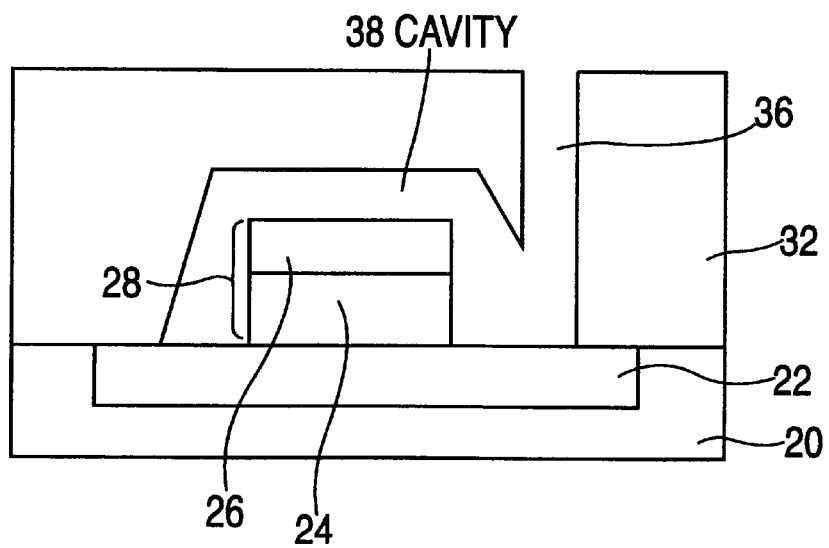
Figure 3C:
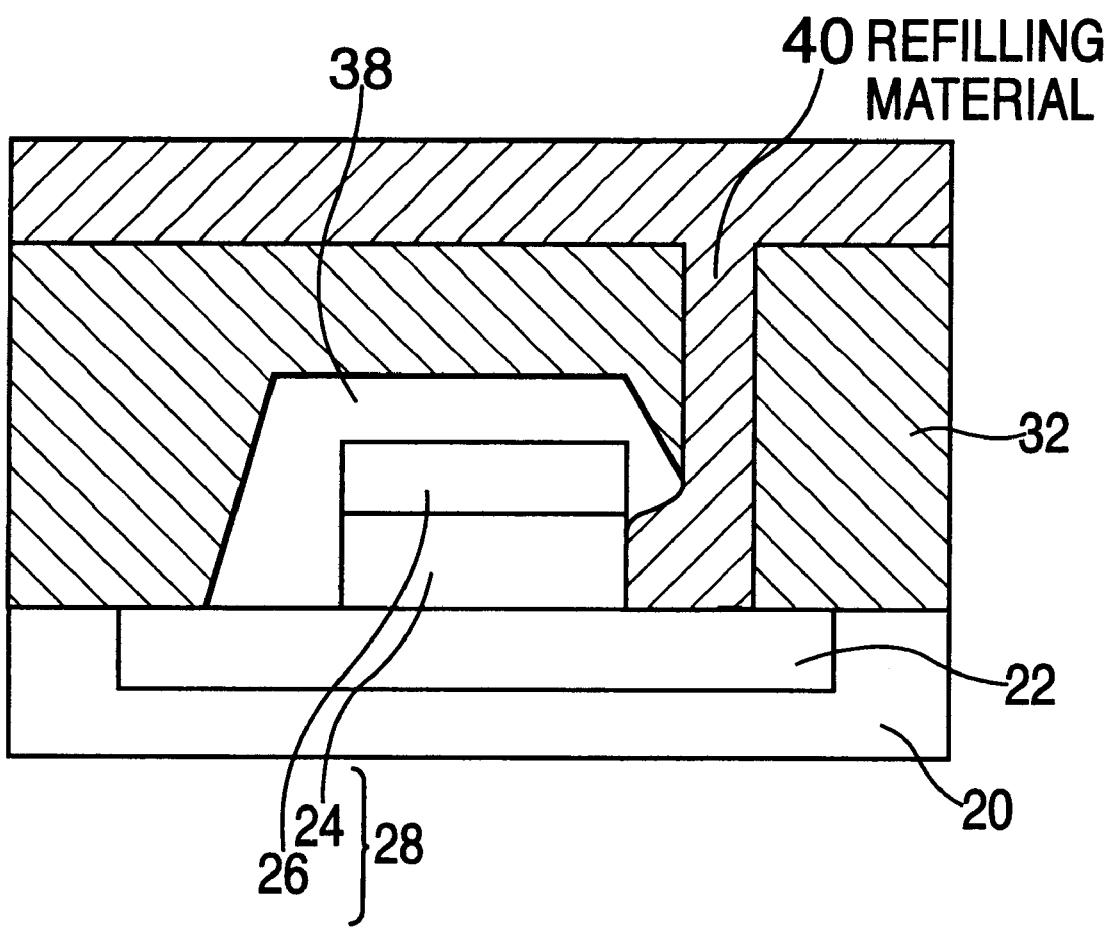

Referring to FIGS. 3a to 3c, there is illustrated a method for forming a cavity for a fusible link on a silicon substrate in accordance with the present invention. Each of the fusible links is connected to circuitry on the silicon substrate for blowing redundant memory cells.

Referring to FIG. 3a, the method is initiated with applying an etchable material over and around a portion of the fusible link. Specifically, first, a silicon substrate 20 is prepared and then a portion of the silicon substrate 20 is covered with an insulating layer 22 by a conventional depositing technique. The insulating layer 22 is made of an oxide such as a silicon oxide.

Then, a fusible line 28 is formed using conventional photolithographic methods. For example, a film of gate material 24 such as a doped polysilicon and a gate wiring 26 such as a tungsten silicide $WSi^2$ are sequentially deposited over the silicon substrate 20, and patterned lithographically and substantially etched to form the fusible line 28 including the doped polysilicon gate material 24 and tungsten silicide gate wiring 26. The gate material 24 is formed of a polysilicon, which may be doped with either $N^+$ or $P^+$ impurities, and acts as the wordline W/L of the memory cell. The gate material 24 and the gate wiring 26 have a width that equals a minimum lithographic feature size. The fusible link is preferably connected to the gate region of the field effect transistor(FET), but it is noted that the fusible line may be connected to a source/drain region of the FET 10. A nitride cover 30 is formed to cover the fusible line 28, i.e., the gate wiring 26 and sidewalls of the gate material 24.

The entire top face of the nitride cover 30 is covered with a protective layer 32 of dielectric material. Preferably, the protective layer 32 is made of a silicon oxide deposited at low temperature using chemical vapor deposition(CVD). The protective layer 32 is needed to protect the device from deterioration due to humidity and various surface effects. It is also used for isolation apart from the heat control layer.

Thereafter, an access 36 through the protective layer 32 is formed by using a conventional lithography process. It is noted that the access 36 adjoins at least a portion of the nitride cover 30. Specifically, a layer of photoresist mask 34 is applied, exposed and developed to form an etching hole 35 under which the access 36 is to exist. Then, the protective layer 32 is anisotropically etched to form the access 36 abutting the nitride cover 30.

The nitride cover 30 over and around the fusible line 28 is selectively removed by an isotropic etching, leaving the fusible link 28 surrounded by a cavity 38. It is preferable that the nitride cover 30 is etched by a dry etching. Then, the mask is removed to expose the protective layer 32 as shown in FIG. 3*b*.

Thereafter, the access 36 is refilled with a refilling material 40 by a conventional depositing process. It is noted that the refilling material 40 has a required viscosity so that almost all of the cavity 38 may remain without being refilled with the refilling material 40 as shown in FIG. 3*c*. The cavity 38 may accommodate the molten metal of the fusible link 28 during the blowout thereof, thereby preventing unwanted shorts or low resistance therein.

While the present invention has been described with respect to the particular embodiments, it will be apparent to those skilled in the art that various changes and modifications may be made without departing from the spirit and scope of the invention as defined in the following claims.

What is claimed is:

1. A method for forming a cavity for a fusible link in a semiconductor device comprising the steps of:

applying an etchable material over and around a portion of the fusible link;

coating the etchable material with a protection layer;

forming an access abutting the etchable material through the protection layer;

removing the etchable material to leave a cavity; and refilling the access with a refilling material.

2. The method of claim 1, wherein the step of forming the access includes the steps of:

applying, exposing and developing a layer of photoresist mask to form an etching hole under which the access is to exist;

anisotropically etching the protection layer to form the access abutting the etchable material.

3. The method of claim 2, wherein the etchable material is removed by an isotropical etching highly selective to the etchable material.

4. The method of claim 3, wherein the refilling material has a predetermined viscosity so that the cavity remains unfilled.

5. The method of claim 4, wherein the etchable material is made of a nitride.

6. The method of claim 4, wherein the protection layer is made of an oxide.

* * * * *